US006775385B1

(12) United States Patent
Coombs

(10) Patent No.: US 6,775,385 B1
(45) Date of Patent: Aug. 10, 2004

(54) LOUDSPEAKER FREQUENCY DISTRIBUTION AND ADJUSTING CIRCUIT

(75) Inventor: Jeffery James Coombs, Lake Havasu City, AZ (US)

(73) Assignee: James Loudspeaker, LLC, Lake Havasu City, AZ (US)

( * ) Notice: Subject to any disclaimer, the term of this patent is extended or adjusted under 35 U.S.C. 154(b) by 712 days.

(21) Appl. No.: 09/668,029

(22) Filed: Sep. 21, 2000

Related U.S. Application Data

(60) Provisional application No. 60/154,942, filed on Sep. 21, 1999.

(51) Int. Cl.[7] .................................................. H03G 5/00
(52) U.S. Cl. ........................................... 381/99; 381/98
(58) Field of Search ...................................... 381/99, 98

(56) References Cited

U.S. PATENT DOCUMENTS 3,947,636 A 3/1976 Edgar
3,989,897 A 11/1976 Carver
4,113,983 A 9/1978 Steel
4,243,840 A * 1/1981 Kates .......................... 381/99
4,426,552 A 1/1984 Cowans et al.
4,429,181 A * 1/1984 Freadman .................... 381/99
4,771,466 A 9/1988 Modafferi
4,888,811 A 12/1989 Takashi
5,361,381 A 11/1994 Short
5,400,405 A 3/1995 Petroff
5,493,620 A 2/1996 Pulfrey
5,519,781 A 5/1996 Kukurudza
5,596,650 A 1/1997 Hlibowicki
5,661,808 A 8/1997 Klayman
5,850,453 A 12/1998 Klayman et al.
6,081,602 A 6/2000 Meyer et al.
6,115,475 A 9/2000 Alexander
6,381,334 B1 * 4/2002 Alexander ................... 381/99

OTHER PUBLICATIONS

PCT International Preliminary Examination Report for the related international application No. PCT/US00/26089, Jul. 16, 2001.

* cited by examiner

*Primary Examiner*—Minsun Oh Harvey
*Assistant Examiner*—Laura A. Grier
(74) *Attorney, Agent, or Firm*—Richard E. Oney; Fennemore Craig

(57) ABSTRACT

An audio frequency distribution and adjusting circuit includes a variable resistor network having a first variable resistance and a second variable resistance coupled in series between a first resistor network terminal and a second resistor network terminal. The variable resistor network also includes a wiper contact with the first variable resistance and the second variable resistance for adjusting the total resistance between the resistive network terminals. The variable resistor network terminals are coupled in parallel with a low-pass filter, which is coupled to a low-frequency driver. The resistor network wiper contact is electrically coupled to the input of the high-pass filter, which is coupled to a high-frequency driver.

32 Claims, 9 Drawing Sheets

LOUDSPEAKER FREQUENCY DISTRIBUTION AND ADJUSTING CIRCUIT

RELATED APPLICATION

This application claims the benefit of U.S. Provisional Application No. 60/154,942, filed Sep. 21, 1999, entitled "Frequency Adjusting and Distribution Circuit for Loudspeakers."

BACKGROUND

This invention relates generally to electro-acoustic or audio loudspeaker systems. More specifically, it relates to an apparatus for adjustably filtering an electrical audio signal into a plurality of frequency bands and distributing the audio signal to one or more drivers within a loudspeaker system.

Audio systems present, as an audible signal, a range of audio frequencies. One important characteristic of high-fidelity speaker systems is the relative magnitude response of the speaker system over this audio frequency range. An audio amplifier may provide an electrical input to a speaker system that covers the entire spectrum of audio frequencies that are detectable by the human ear. However, in the present state of the art, a single loudspeaker, or driver, is not capable of accurately reproducing all audio frequencies that are detectable by the human ear. Rather, high fidelity loudspeaker systems have been realized by dividing the audio frequency spectrum into two or more frequency bands and applying each of these bands of the audio spectrum to a separate driver or group of drivers. For example, low frequencies tend to be better replicated by physically larger drivers, commonly known as woofers. Mid-range frequencies, likewise, are more favorably reproduced by a mid-range sized driver. Additionally, higher frequencies are better reproduced by physically smaller drivers, commonly known as tweeters. On the other hand, connecting high-power, low-frequency signals to a tweeter driver, will cause audible distortion and will typically cause fatigue and destruction of the tweeter driver.

To ensure that only the proper frequencies of an electrical audio signal are routed to the appropriate driver, special electrical filters, called crossover networks, have been provided in speaker systems. These networks allow the different drivers or groups of drivers, each adapted for best response to a particular range or band of frequencies, to be combined in a single system capable of wide audio frequency coverage. Thus, the crossover circuit directs the frequency content of the electrical signals over a wide audio range to the appropriate driver or group of drivers in a multi-driver loudspeaker system. Conventional crossover network filter topologies, belong to three classifications according to the frequencies passed and rejected, as follows: (1) low-pass for woofers, (2) band-pass for midranges, and (3) high-pass for tweeters. Where more than one filter is used, the frequency common to adjacent ranges or passbands is called the crossover frequency.

The conventional crossover network design attempts to blend the acoustic output of the multiple drivers to achieve good tonal balance characterized by a smooth transition in acoustic output from one driver to another. One way to accomplish this is a symmetrical crossover network that functions as a filter to assure the response drop-off of one driver as frequency increases through the transition region is a mirror image of the response increase of a companion driver reproducing the adjacent higher frequency band of sound. Proper implementation of this design approach requires that the combination of drivers and crossover networks do not introduce audible artifact (an unnatural sound quality) resulting from frequency response irregularities or phase cancellation effects that potentially result from housing multiple drivers in one speaker enclosure. Thus, conventional wisdom is that a well-designed loudspeaker system exhibits a frequency response in which the output amplitude is relatively flat to desired accuracy (e.g., +/−3 dB from 40 Hz to 20 kHz) and phase is linear to desired accuracy. Typically, this frequency response is measured in an anechoic environment, i.e., an environment that is free from echoes and reverberations.

Even if a speaker is designed to have a relatively flat frequency response in an anechoic environment, however, the quality of the sound heard by the listener will vary depending on the acoustical environment in which the speaker system is placed. Thus, the audio characteristics of a given room in which the speaker system is placed can alter the nature and realism of the sound. For example, a room having reflective surfaces will color the sound output of the speaker, resulting in an unnatural sound. Consequently, to enable a speaker system to be tuned to variable acoustical environments in order to accomplish a more natural sound, it is desirable to provide a speaker system having a frequency response that can be adjusted to accommodate the wide diversity of acoustical environments in which the speaker may be placed.

Another important characteristic of a loudspeaker system is its damping factor. Technically, the damping factor of a system refers to the ratio of nominal loudspeaker impedance to the total impedance driving it (amplifier and speaker cable). In practice, damping is the ability of the amplifier to control driver motion once the input signal to the driver has stopped. A high damping factor means that the amplifier's impedance can absorb the electricity generated by driver coil motion, thereby stopping the driver's vibration. Damping varies with frequency. The effects of damping are most apparent at low frequencies, in the range of the woofer's resonance. Speakers that are well damped sound "tighter," while speakers that have a low damping factor result in mushy or indistinct sound. Consequently, it is also desirable to provide a speaker system having a high damping factor.

Another important characteristic of a loudspeaker system is its sensitivity. This characteristic measures the ability of a loudspeaker system to turn electrical energy into acoustical energy. The more sensitive a loudspeaker is, the better it converts electrical energy into acoustical energy. Thus, a more sensitive speaker system is easier to drive. For example, 90 dB sensitivity means that when an amplifier input to the speaker system is set at one watt, the Sound Pressure Level (SPL) output measured at a distance of one meter away from the speaker will be 90 dB, at a given frequency. A speaker that has a 93 dB sensitivity rating, however, will have measured SPL output of 93 dB when the input signal to the speaker is set at one watt.

Still another important characteristic of a loudspeaker system is its dynamic range. The dynamic range is calculated as the difference between the total noise floor (measured in dB(A)) and the equivalent SPL (measured in dB) where a certain amount of total harmonic distortion appears. A speaker system having a greater dynamic range can better handle higher power input, can produce a wider range of sound pressure level output and can reproduce a wider frequency range, all with less distortion.

It is an object of the present invention, therefore, to provide an adjustable loudspeaker frequency distribution apparatus that can be used to easily adjust the frequency output and tonal qualities of a loudspeaker system to accommodate differing acoustical environments in which the loudspeaker system may be placed.

It is another object of the invention is to provide an apparatus that improves the power handling capability and dynamic range of the speaker system.

It is yet another object of the invention is to provide an apparatus that enables the amplifier to better control the speaker voice coil, thereby improving the effective damping factor of the speaker.

Additional objects and advantages of the invention will be set forth in the description that follows, and in part will be apparent from the description, or may be learned by practice of the invention. The objects and advantages of the invention may be realized and obtained by means of the instrumentalities and combinations pointed out in the appended claims.

SUMMARY

To achieve the foregoing objects, and in accordance with the purposes of the invention as embodied and broadly described in this document, there is provided a frequency distribution and adjusting circuit that includes an input pair having a positive input and a negative input for receiving an input signal from an amplifier. A low-pass filter has an input electrically coupled to the positive input of the input pair and an output electrically coupled to an input of a low frequency driver, or woofer. A high-pass filter is electrically coupled to at an input of a high frequency driver, or tweeter. A variable resistor network includes a first variable resistance and a second variable resistance coupled in series between a first resistor network terminal and a second resistor network terminal. The variable resistor network also includes a wiper contact with the first variable resistance and a second variable resistance for adjusting the total resistance between the resistive network terminals. The variable resistor network terminals are coupled in parallel with the low-pass filter, and the wiper contact is electrically coupled to the input of the high-pass filter.

BRIEF DESCRIPTION OF THE DRAWINGS

The accompanying drawings, which are incorporated in and constitute a part of the specification, illustrate the presently preferred embodiments and methods of the invention and, together with the general description given above and the detailed description of the preferred embodiments and methods given below, serve to explain the principles of the invention.

DESCRIPTION

Reference will now be made in more detail to the presently preferred embodiments and methods of the invention as illustrated in the accompanying drawings.

As used herein, the term "amplifier" refers to any device or electronic circuit which has the capability to amplify an electrical audio signal to sufficient power for use by a coupled loudspeaker. These devices are frequently referred to as power amplifiers, or amps.

As used herein, the term "source device" refers to an apparatus for the generation of an electrical audio signal, such as a device which develops electrical audio frequency signal wholly within itself, for example a test signal generator. The term also includes an apparatus for the generation of an electrical audio frequency signal from an originally acoustic action, for example a microphone. The term also includes an apparatus for the generation of an electrical audio frequency signal from an originally mechanical action, for example an electric guitar, or electronic keyboard. Likewise, the term includes an apparatus for the generation of an electric audio frequency signal from recorded or programmed media, for example a tape player, phonograph, compact disc player, DVD player or synthesizer. In addition, the term includes an apparatus for the generation of an electric audio frequency signal from a radio frequency (RF) broadcast, for example a tuner.

As used herein, the term "electro-acoustic transducer" refers to an apparatus for the conversion of an electrical audio frequency signal to an audible signal.

As used herein, the term "driver" refers to an electro-acoustic transducer most commonly connected to the output of an amplifier, either directly or via an electrical filter, also sometimes referred to as a "raw speaker."

As used herein, the term "speaker" refers to an apparatus consisting typically of a box-like enclosure with one or more drivers and a filter installed therein, for the purpose of converting the electrical audio frequency signal of, for example, music or speech to the audible signal of such music or speech. Such drivers would be different in regard to the portion of the audible frequency spectrum that they were designed to accommodate.

As used herein, the term "filter" refers to at least one electrical element, for example a capacitor, or inductor wired in-circuit between the output of an amplifier and the input of a driver, the purpose of which is to attenuate frequencies inappropriate to a specific driver, typically located within the box-like enclosure of the speaker.

As used herein, the term "audio system" refers to any device or set of devices which contain a speaker, an amplifier and a source device.

Figure 1:
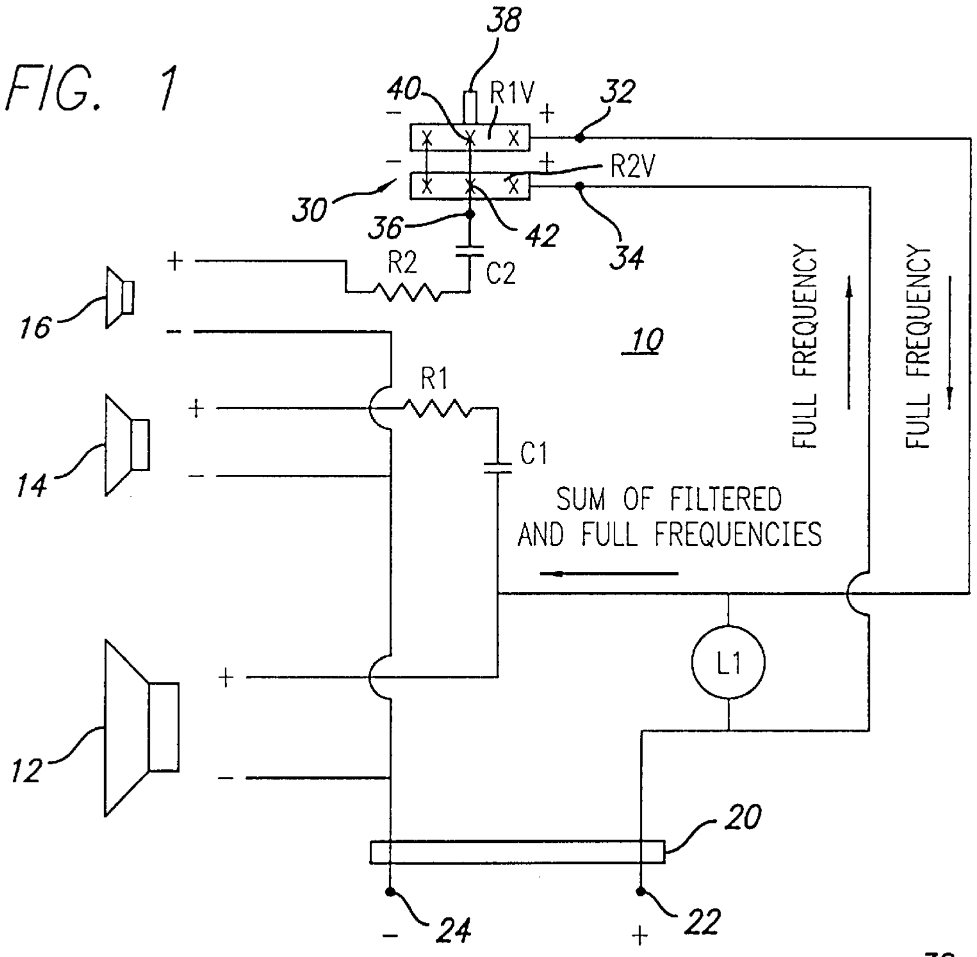
FIG. 1 is an electrical circuit diagram illustrating a typical audio loudspeaker system having three drivers and showing a preferred embodiment of a frequency distribution and adjusting circuit according to the invention.

FIG. 1 depicts a simplified schematic diagram of a loudspeaker system 10, including a frequency distribution and adjusting circuit in accordance with a preferred embodiment of the present invention. By way of illustration, FIG. 1 shows the invention in a system having three separate speakers, namely, a low-range frequency driver 12, a mid-range frequency driver 14, and a high-range frequency driver 16. In place of the conventional crossover circuits, there is provided a frequency distribution and adjustment circuit that is configured as explained below to feed all of the drivers 12, 14, 16. Each of the drivers is of the moving coil type, and the drivers are together intended to handle the entire audible range of sound waves, with, in most cases, a certain degree of overlap between the adjacent drivers. Also, each of the drivers 12, 14, 16 has a pair of inputs, indicated respectively as positive and negative.

The speaker system 10 is intended to be coupled to the output of an amplifier, which in turn is coupled to a suitable source device (not shown). An electrical audio signal can be output from the amplifier and input to the speaker system 10 via an input pair 20 having a positive input 22 and a negative input 24. The electrical audio signal includes a range of audio frequencies. To facilitate the partitioning of the electrical audio signal into frequency bands, the frequency distribution and adjustment circuit of the present invention includes an inductor L1 having an input end that is electrically coupled to the positive input 22. The inductor L1 is electrically coupled in series with the low-frequency electro-acoustic transducer 12, which is also known as a woofer, or a low-frequency driver. The inductor L1 acts as a low-pass filter to attenuate middle and higher frequency content of the electrical audio signal.

In a preferred embodiment, the value of inductor L1 is selected from a range of about 1 milliHenry to about 12 milliHenries for a driver 12 exhibiting an impedance of approximately 4 to 16 ohms. In one exemplary embodiment, the inductor L1 has a value of 12 milliHenries and the driver 12 is an 8-ohm, 10-inch sandwich cone woofer. It should be pointed out that while the present example includes an 8-ohm, 10-inch sandwich cone woofer, all known types of woofer or full range drivers may be employed.

To further facilitate the partitioning of the electrical audio signal into frequency bands, the frequency distribution and adjustment circuit includes a capacitor C1 that is coupled in series between the second end of the inductor L1 and the positive input of the mid-range frequency electro-acoustic transducer 14, which is also known as a mid-range driver. Optionally, a resistor R1 can be coupled in series between the capacitor C1 and the positive input of the mid-range frequency driver. In a preferred embodiment, the value of capacitor C1 is selected from the range of about 50 microFarads to about 200 micrFarads, and the value of resistor R1 is selected from the range of about zero ohms to about 20 ohms, depending on the efficiency of the specific driver 14 used. In one exemplary embodiment, the value of resistor R1 is about 4.1 ohms, capacitor C1 is a 200-volt electrolytic capacitor having a value of about 200 microFarads, and the midrange driver 14 is an 8-ohm, 6.5-inch sandwich cone bass midrange driver. It should be pointed out, however, that all known types of midrange drivers may be employed for driver 14.

To still further facilitate the partitioning of the electrical audio signal into frequency bands, the frequency distribution and adjustment circuit includes a variable resistor network 30, including a first variable resistive leg R1V and a second variable resistive leg R2V. Each of the first variable resistive leg R1V and a second variable resistive leg R2V has a first terminal designated as positive and the second terminal designated as negative. The first variable resistive leg R1V and the second variable resistive leg R2V are coupled in series between a first resistor network terminal 32 and a second resistor network terminal 34. The negative terminals of the resistive legs R1V and R2V are electrically connected, or bridged, together. It is believed that this bridge reduces signal distortion. A presence control knob 38 is coupled to a wiper contact 40, which is in electrical contact with resistive leg R1V. The presence control knob 38 also is coupled to a wiper contact 42, which is in electrical contact with resistive leg R2V. The presence control knob 38 can be adjusted to vary the wiper contact point along each of the resistive legs R1V and R2V. The wiper contacts 40, 42 are electrically connected together and are also electrically connected to a wiper output terminal 36 of the variable resistor network 30. In this configuration, the total resistance between the resistive network terminals 32 and 34 can be continuously adjusted between zero and a value equal to the sum of the full resistance of R1V and R2V. The series combination of resistive legs R1V and R2V is coupled in a shunt or parallel configuration with the inductor L1 for partially bypassing a portion of the full frequency electrical audio signal energy around the inductor L1.

Still referring to FIG. 1, a capacitor C2 is coupled in series between the wiper output terminal 36 and the positive input of the high-range frequency electro-acoustic transducer 16, which is also known as a tweeter or high-range frequency driver. The capacitor C2 acts as a high-pass filter to attenuate middle and lower frequency content of the electrical audio signal. Optionally, a resistor R2 can be coupled in series between the capacitor C2 and the positive input of the high-range frequency driver. In a preferred embodiment, the value of capacitor C2 is selected from the range of about 1 microFarad to about 5 microFarads, and the value of resistor R2 is selected from the range of about zero ohms to about 20 ohms, depending on the efficiency of the specific driver used. In one exemplary embodiment, the value of resistor R2 is about 2 ohms, capacitor C2 is a 3.3 microFarads mylar capacitor and the high-range driver 16 includes an 8-ohm, one-inch soft dome tweeter. It should be pointed out, however, that all known types of high-range drivers may be employed.

Figure 3:
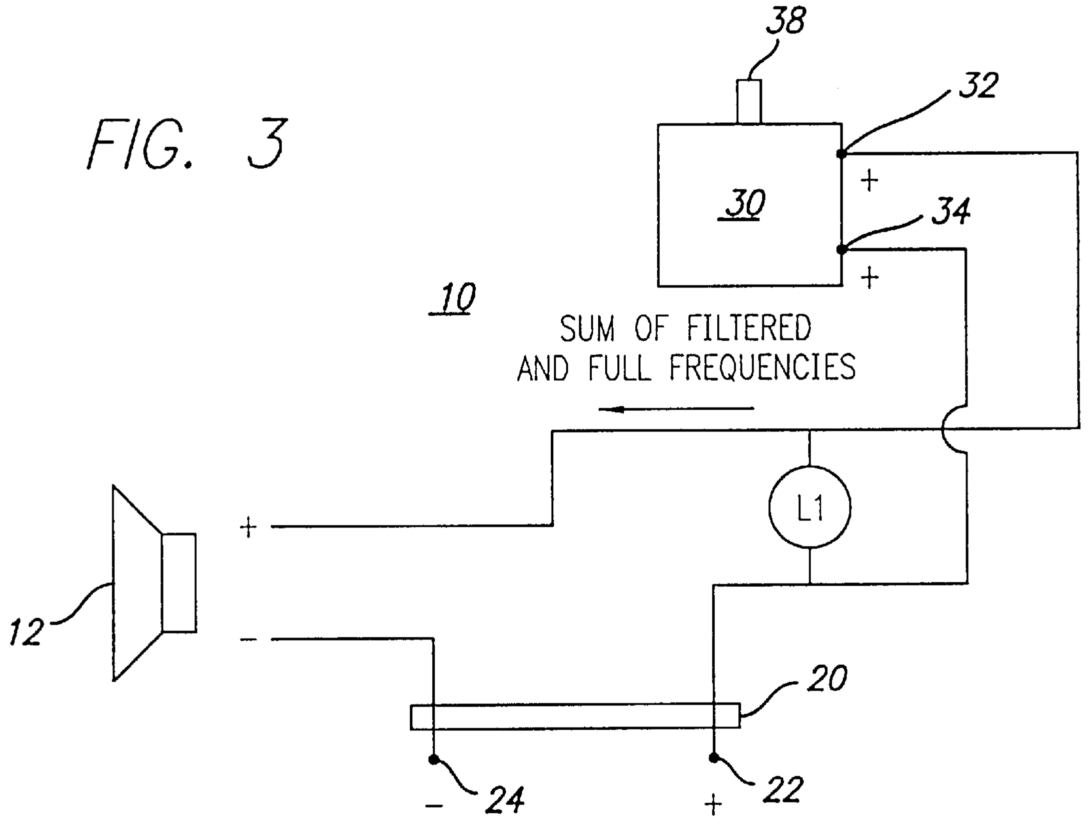
FIG. 3 is an electrical circuit diagram illustrating an audio loudspeaker system having a single driver and a frequency distribution and adjusting circuit according to the invention.

In the exemplary embodiment, the variable resistor network 30 is implemented using a 100-watt, two-channel (stereo) 8-ohm L-pad. As shown in FIG. 3, the wiper contacts 40, 42 for each channel of the L-pad are electrically connected together and are also electrically connected to the wiper output terminal 36 of the variable resistor network 30. In this exemplary embodiment, each of the variable resistive legs R1V and R2V has a resistance of about 8 ohms. Thus, the total resistance between resistive network terminals 32 and 34 can be adjusted between zero and about 16 ohms. The resistive legs R1V and R2V comprise wire windings. It is believed that this provides a signal time delay, which contributes to the benefits of the invention. A suitable L-pad, having part no. 13-3035, is available from Coast Electronics Supply of Cerritos, Calif.

Figure 4:
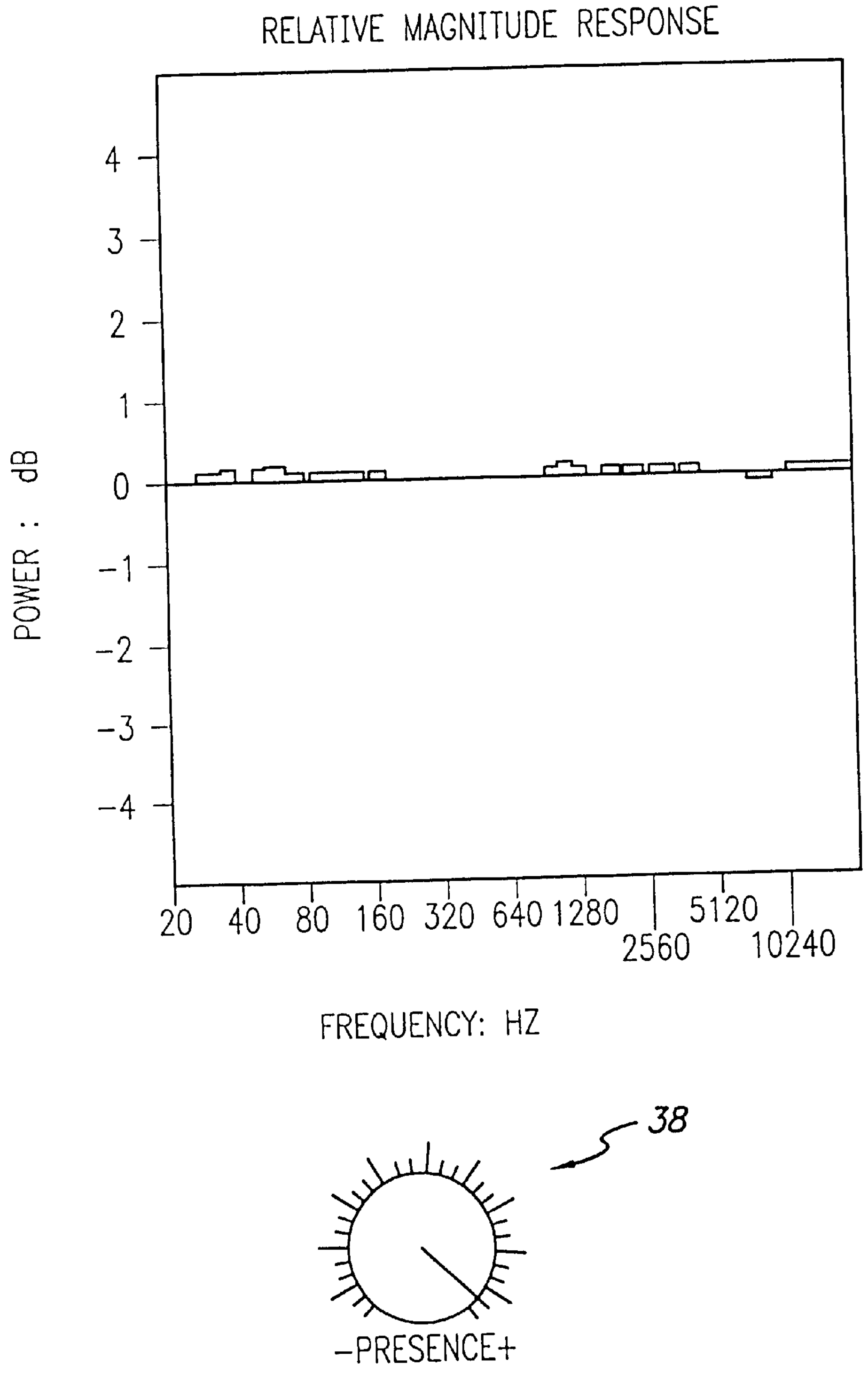
FIG. 4 illustrates an example of the overall on-axis frequency response of a loudspeaker system of the type shown in FIG. 1 over a portion of the audio frequency band with the presence control set at the maximum setting.

Loudspeaker systems of the type shown in FIG. 1 have been built in accordance with the present invention. FIG. 4 illustrates the composite relative magnitude response over frequency of one such loudspeaker system with the presence control set at the maximum setting, i.e. with the wiper contacts 40, 42 positioned at the positive terminal of resistive legs R1V and R2V. The magnitude response is that of the whole system, i.e, it includes the total acoustic sum of all drivers on axis. As shown in FIG. 4, the relative magnitude response of the system is a relatively flat over the frequency range shown.

Figure 5:
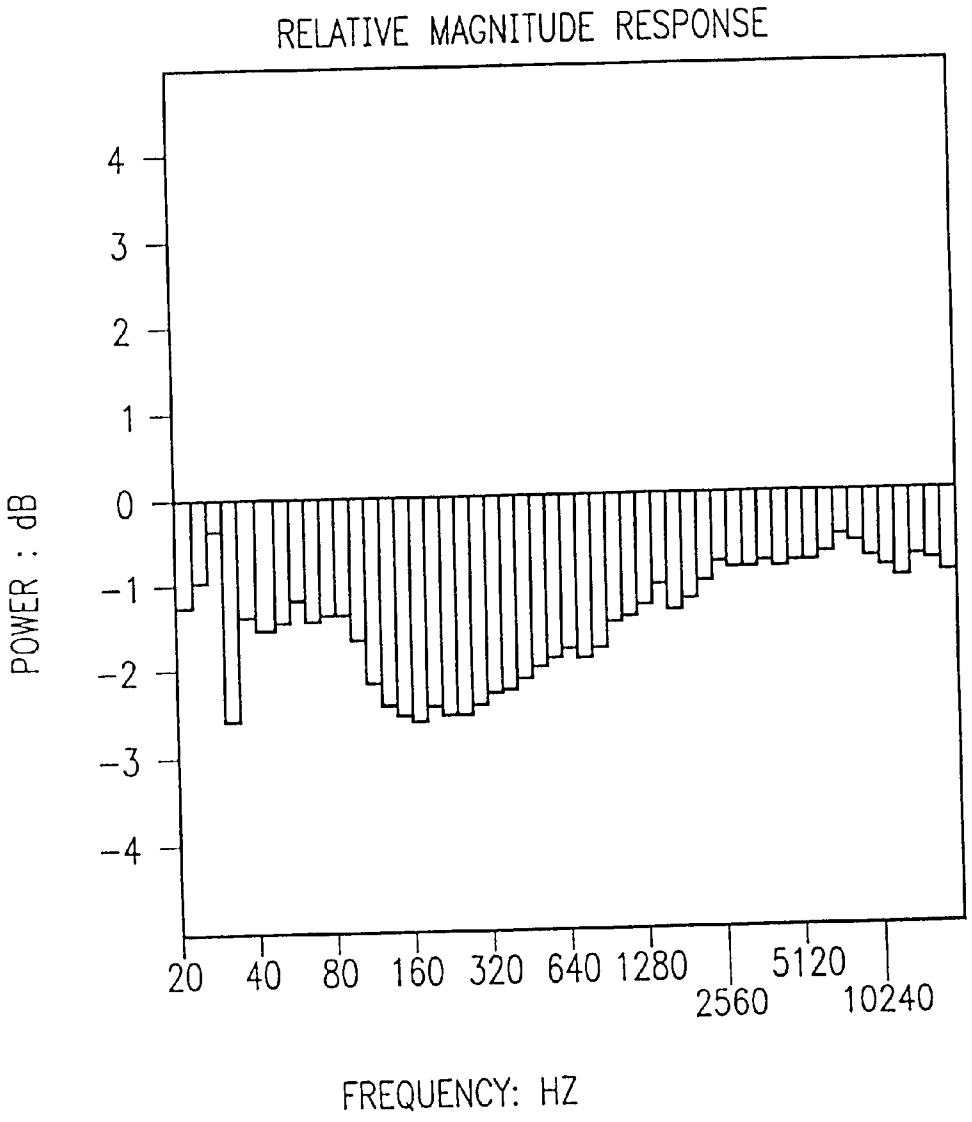
FIG. 5 illustrates the overall on-axis relative magnitude response of a loudspeaker system of the type of FIG. 1 over a portion of the audio frequency band with the presence control set at approximately 80 percent of the maximum setting.
Figure 5:
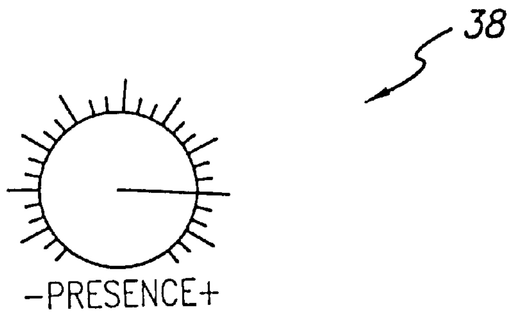

FIG. 5 illustrates the overall on-axis relative magnitude response of the loudspeaker system of FIG. 1 over a portion of the audio frequency band with the presence control set approximately 80 percent of the maximum setting, i.e. with the wiper contacts 40, 42 positioned approximately 80 percent between the positive and negative terminals of resistive legs R1V and R2V. As shown in FIG. 5, the mid-range frequencies are attenuated more than the low and high frequencies.

Figure 6:
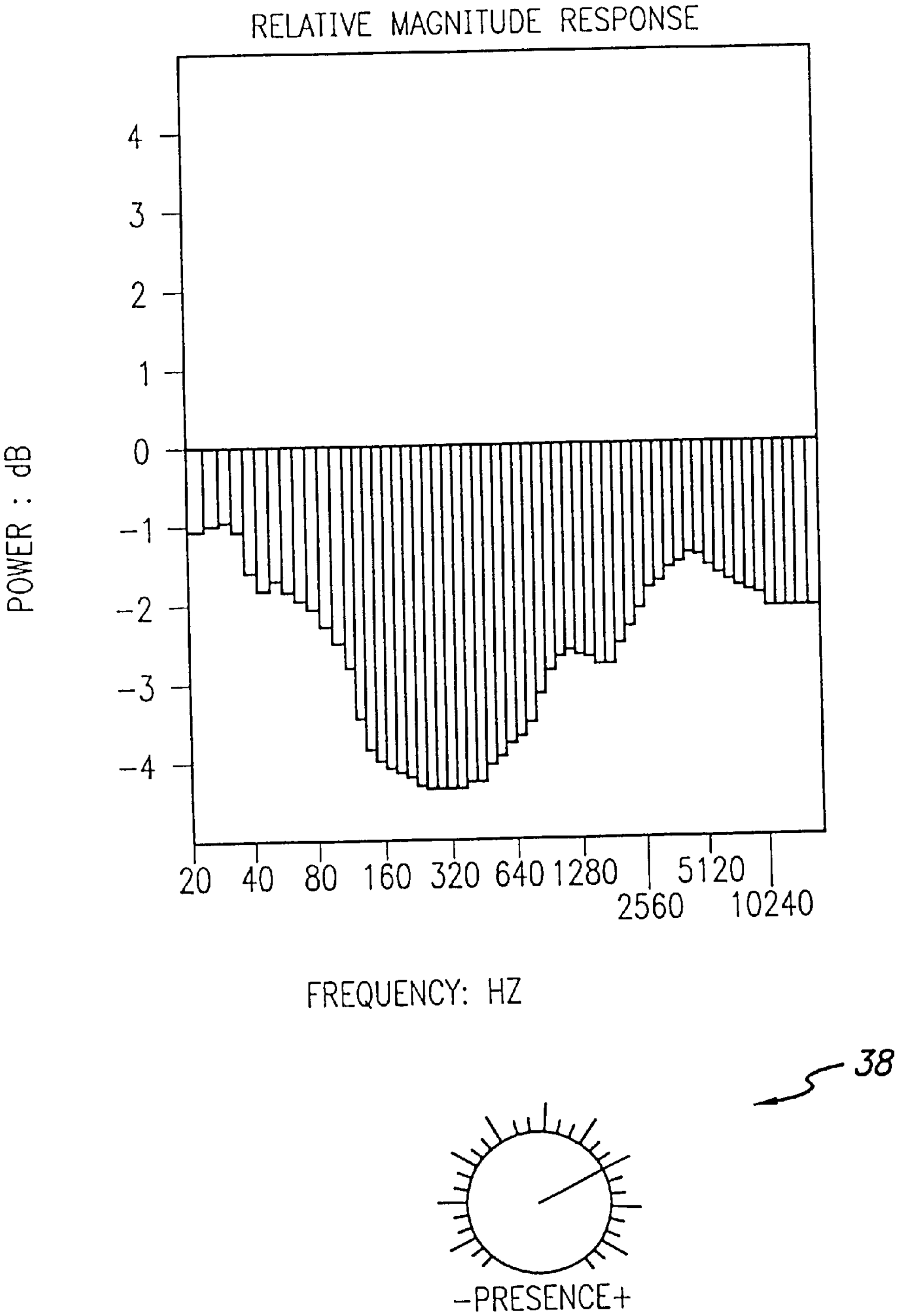
FIG. 6 illustrates the overall on-axis relative magnitude response of a loudspeaker system of the type of FIG. 1 over a portion of the audio frequency band with the presence control set at approximately 70 percent of the maximum setting.

FIGS. 6 illustrates the overall on-axis relative magnitude response of the loudspeaker system of FIG. 1 over a portion of the audio frequency band with the presence control set approximately 70 percent of the maximum setting.

Figure 7:
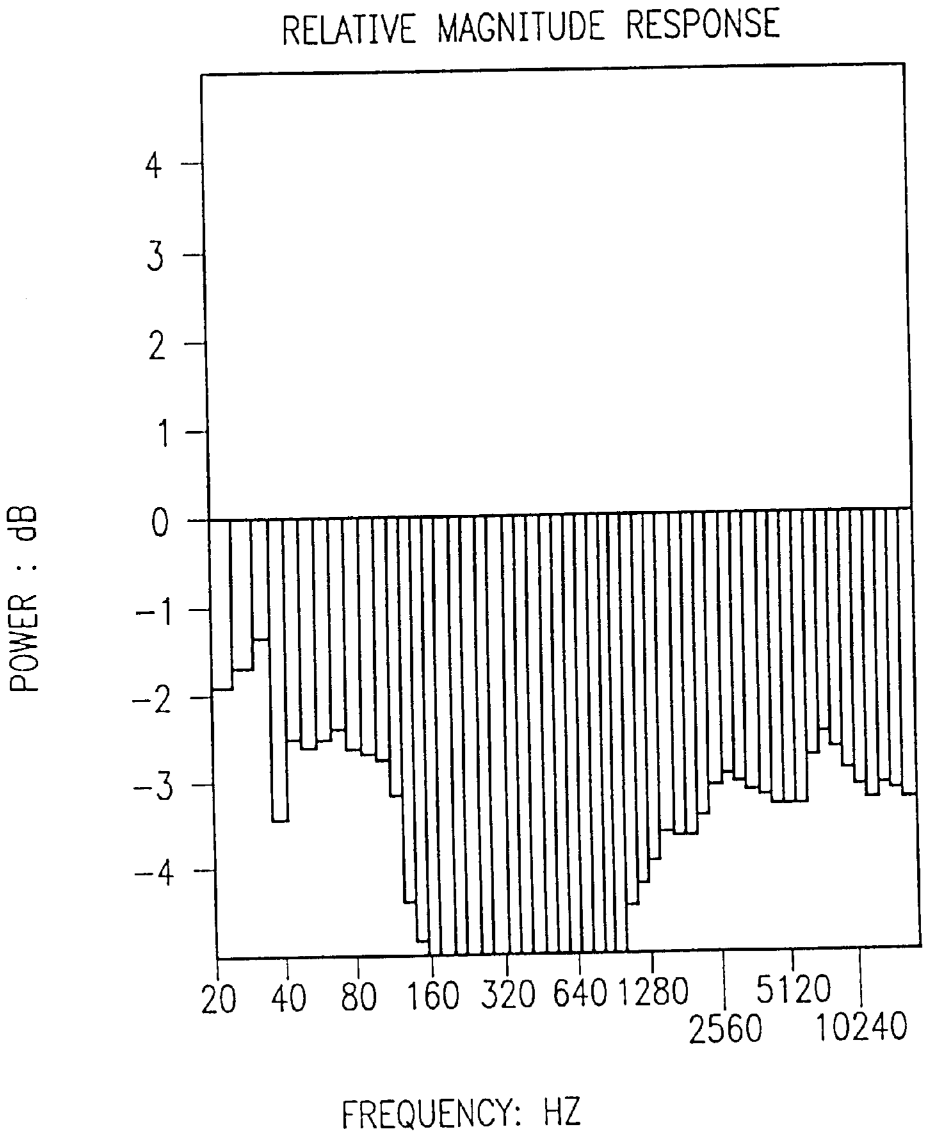
FIG. 7 illustrates the overall on-axis relative magnitude response of the loudspeaker system of FIG. 1 over a portion of the audio frequency band with the presence control set at approximately 60 percent of the maximum setting.
Figure 7:
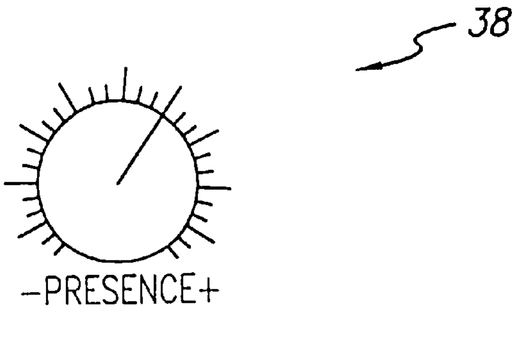

FIG. 7 illustrates the overall on-axis relative magnitude response of the loudspeaker system of FIG. 1 over a portion of the audio frequency band with the presence control set approximately 60 percent of the maximum setting.

Figure 8:
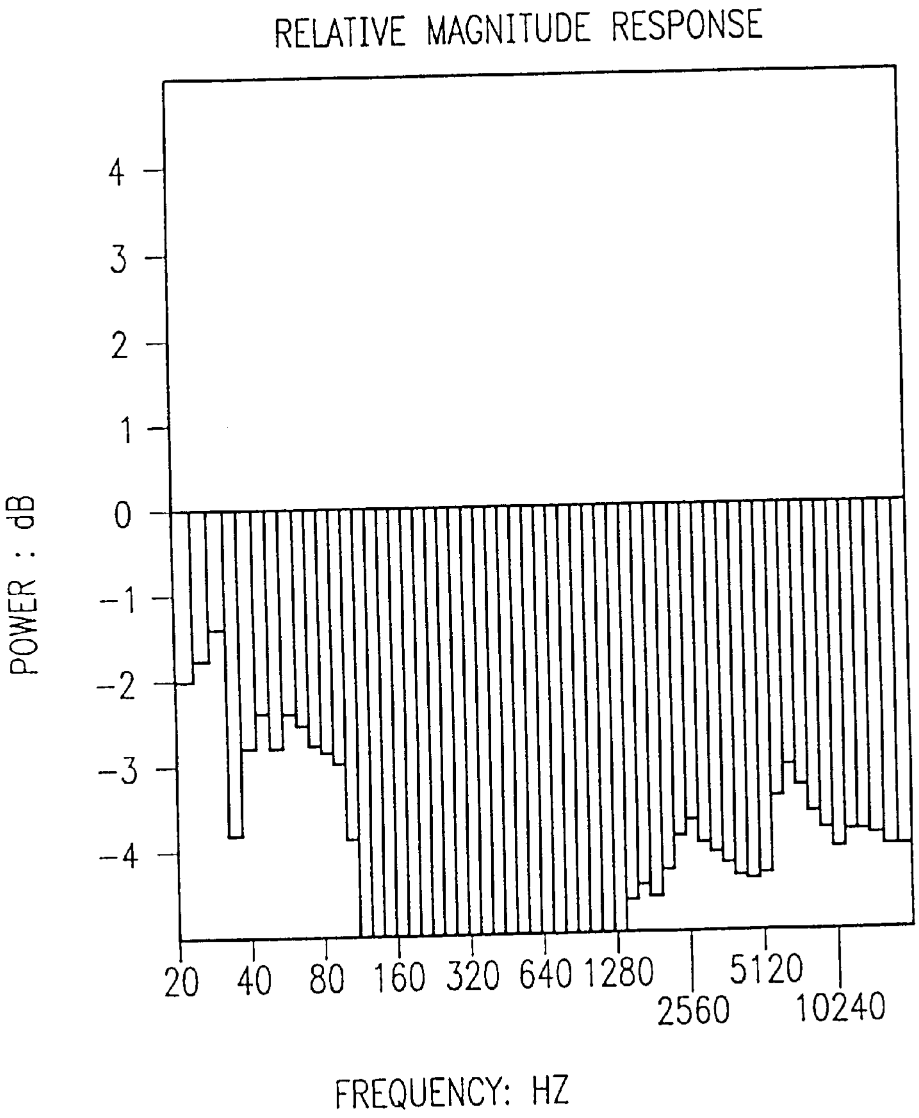
FIG. 8 illustrates the overall on-axis relative magnitude response of the loudspeaker system of FIG. 1 over a portion of the audio frequency band with the presence control set at approximately 50 percent of the maximum setting.
Figure 8:
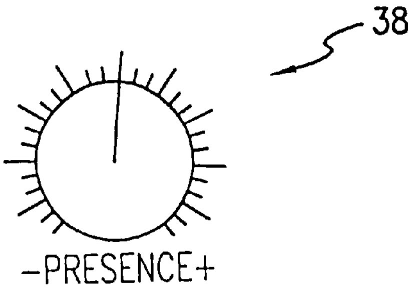

FIG. 8 illustrates the overall on-axis relative magnitude response of the loudspeaker system of FIG. 1 over a portion of the audio frequency band with the presence control set approximately 50 percent of the maximum setting.

Figure 9:
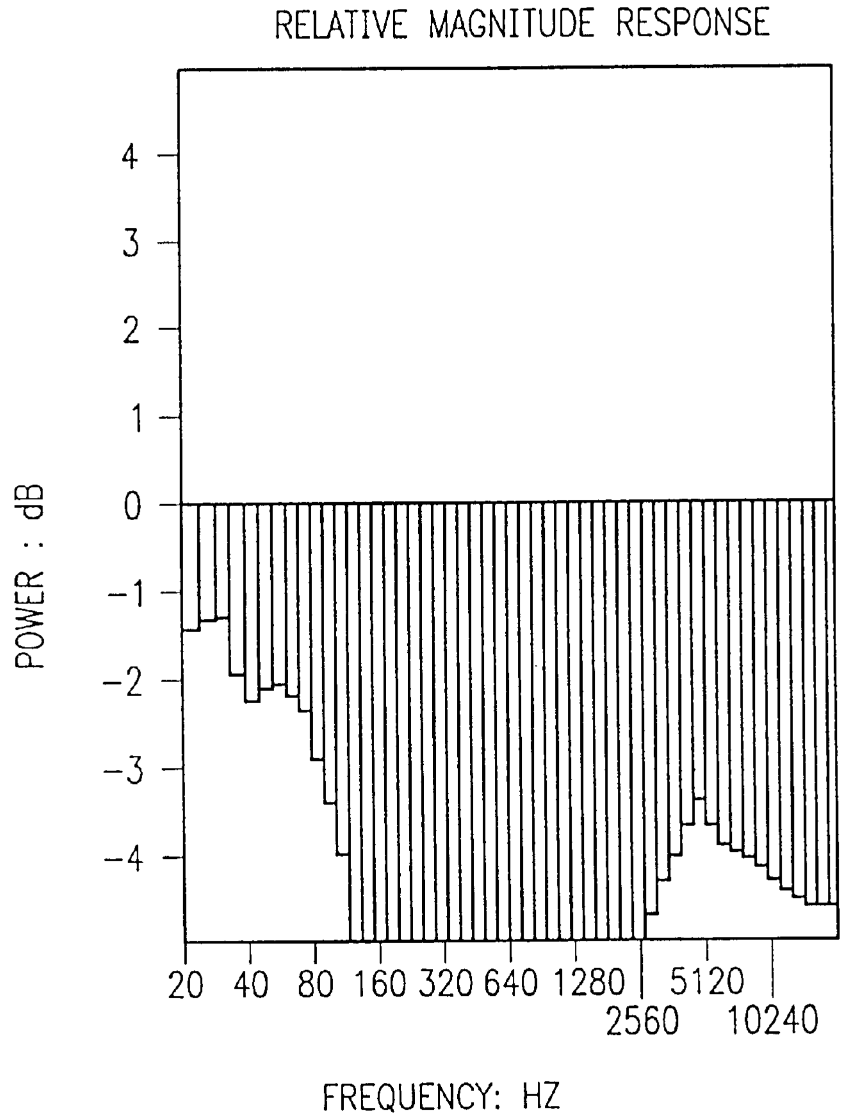
FIG. 9 illustrates the overall on-axis relative magnitude response of the loudspeaker system of FIG. 1 over a portion of the audio frequency band with the presence control set at approximately 40 percent of the maximum setting.
Figure 9:
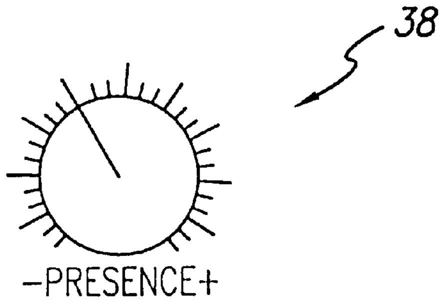

FIG. 9 illustrates the overall on-axis relative magnitude response of the loudspeaker system of FIG. 1 over a portion of the audio frequency band with the presence control set approximately 40 percent of the maximum setting.

Figure 10:
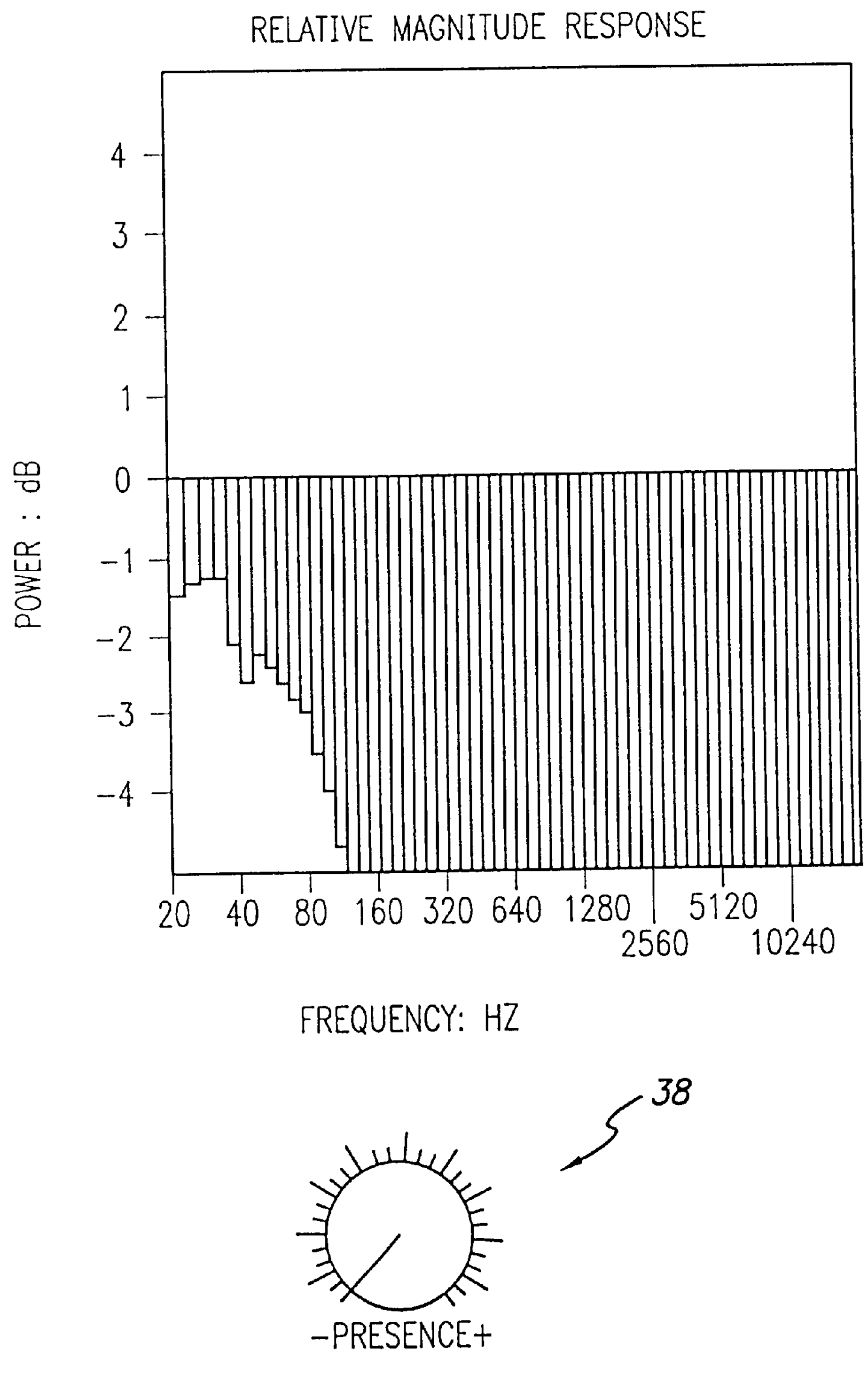
FIG. 10 illustrates the overall on-axis relative magnitude response of the loudspeaker system of FIG. 1 over a portion of the audio frequency band with the presence control set at the minimum setting.

FIG. 10 illustrates the overall on-axis relative magnitude response of the loudspeaker system of FIG. 1 over a portion of the audio frequency band with the presence control set at the minimum setting.

Figure 2:
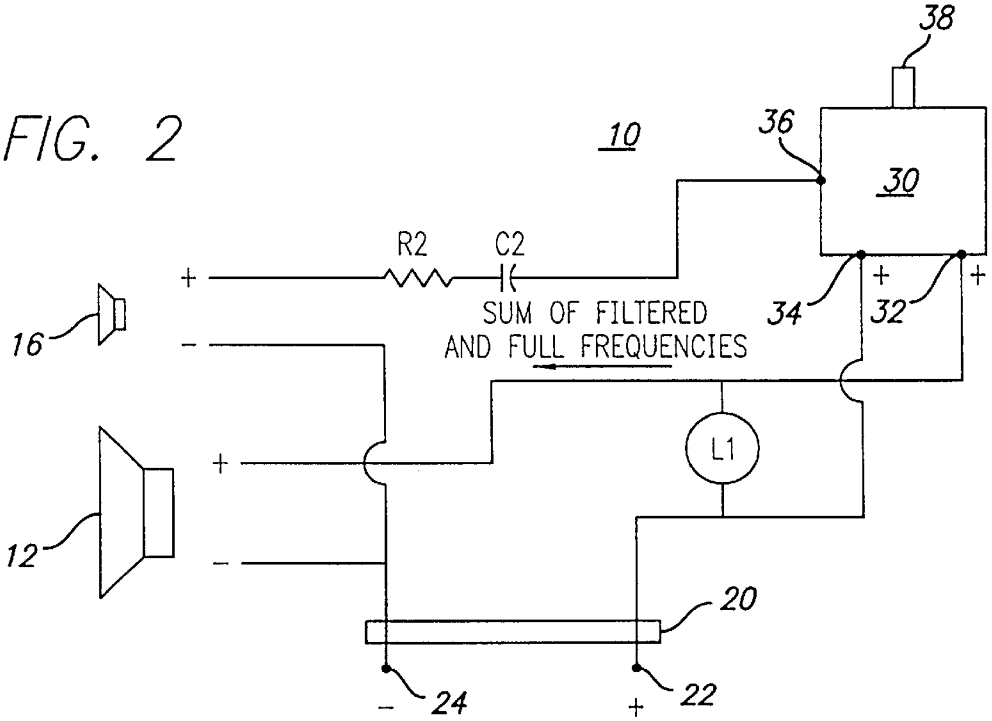
FIG. 2 is an electrical circuit diagram illustrating an audio loudspeaker system having two drivers and a frequency distribution and adjusting circuit according to the invention.

Although the invention has been described above in connection with a speaker system having three drivers, it will be understood to those skilled in the art that the invention also may be used in connection with speaker systems having fewer than three or more than three drivers. For example, FIG. 2 illustrates an audio loudspeaker system having two drivers and a frequency distribution and adjusting circuit according to the invention. Referring to FIG. 2, the speaker system 10 includes a low-frequency driver 12 and a high-frequency driver 16, selected to provide a desired frequency response. The frequency distribution and adjusting circuit includes the inductor L1, capacitor C2, resistor C2 and variable resistor network 30, all configured similarly to that described with respect to FIG. 1.

FIG. 3 illustrates an audio loudspeaker system having a single driver and a frequency distribution and adjusting circuit according to the invention. In this configuration, the speaker system 10 includes a low-frequency or a full-range driver 12, selected to provide a desired frequency response. The frequency distribution and adjusting circuit includes the inductor L1 and the variable resistor network 30. The variable resistor network does not include a connection from the wiper terminal 32 to a driver, but does include the series combination of resistive legs R1V and R2V coupled in a shunt or parallel configuration with the inductor L1 for partially bypassing a portion of the full frequency electrical audio signal energy around the inductor L1.

It has been observed that loudspeaker systems built in accordance with the present invention meet the previously mentioned goals. In such systems, the invention provides an adjustable loudspeaker frequency distribution apparatus that can be used to easily adjust the frequency output and tonal qualities of the loudspeaker system to accommodate differing acoustical environments in which the loudspeaker system may be placed. In addition, the present invention improves the power handling capability and dynamic range of the speaker system. Moreover, it enables the amplifier to better control the speaker voice coil, thereby improving the effective damping factor of the of the speaker. Also, it is believed that the invention reduces phase shift between crossover points.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. In an audio system, a frequency distribution and adjusting circuit for partitioning by frequency an electrical audio signal, as provided by at least one amplifier, into a plurality of electrical audio frequency bands comprising at least one high frequency band and one low frequency band for powering a corresponding plurality of electro-acoustic transducers comprising at least one high frequency electro-acoustic transducer and a low frequency electro-acoustic transducer, the frequency distribution and adjusting circuit comprising:

(a) an input for receiving the electrical audio signal from the at least one amplifier;

(b) a low-pass filter having an input electrically coupled to the electrical audio signal input and an output electrically coupled to an input of the low frequency electro-acoustic transducer;

(c) a high-pass filter having an input and having and output electrically coupled to at an input of the at least one high frequency electro-acoustic transducer; and (d) a variable resistor network including:

a first variable resistance and a second variable resistance coupled in series between a first resistor network terminal and a second resistor network terminal; and a wiper contact with the first variable resistance and the second variable resistance for adjusting the total resistance between the resistive network terminals;

(e) the variable resistor network terminals being coupled in parallel with the low-pass filter; and (f) the wiper contact being electrically coupled to the high-pass input filter.

2. The frequency distribution and adjusting circuit of claim 1 wherein the variable resistor network comprises an L-pad.

3. The frequency distribution and adjusting circuit of claim 2 wherein the L-pad comprises a two-channel L-pad.

4. The frequency distribution and adjusting circuit of claim 3 wherein each channel of the two-channel L-pad has a separate channel wiper contact and the channel wiper contacts are electrically connected to each other.

5. The frequency distribution and adjusting circuit of claim 1 wherein each of the first variable resistance and the second variable resistance comprise a wire winding.

6. The frequency distribution and adjusting circuit of claim 1 wherein the low-pass filter comprises an inductor coupled in series with an input to the low frequency electro-acoustic transducer.

7. The frequency distribution and adjusting circuit of claim 6 wherein the inductor has an inductance in the range from about 1 millihenry to about 12 millihenries, the first variable resistance has a value that can be adjusted between about zero and about 8 ohms and the second variable resistance has a value that can be adjusted between about zero and about 8 ohms.

8. The frequency distribution and adjusting circuit of claim 1 wherein the high-pass filter comprises a capacitor coupled in series with an input to the high frequency electro-acoustic transducer.

9. The frequency distribution and adjusting circuit of claim 8 wherein the capacitor has a capacitance in the range from about 1 microfarad to about 5 microfarads, the first variable resistance has a value that can be adjusted between about zero and about 8 ohms and the second variable resistance has a value that can be adjusted between about zero and about 8 ohms.

10. In an audio system, a frequency distribution and adjusting circuit for partitioning by frequency an electrical audio signal, as provided by at least one amplifier, into a plurality of electrical audio frequency bands comprising a high frequency band, a midrange frequency band and a low frequency band for powering a corresponding plurality of electro-acoustic transducers comprising a high frequency electro-acoustic transducer, a midrange electro-acoustic transducer and a low frequency electro-acoustic transducer, the frequency distribution and adjusting circuit comprising:

(a) an input for receiving the electrical audio signal from the at least one amplifier;

(b) a low-pass filter having an input electrically coupled to the electrical audio signal input and an output electrically coupled to an input of the low frequency electro-acoustic transducer;

(c) a band-pass filter having an input electrically coupled to the low-pass filter output and having an output having an input electrically coupled to an input of the midrange electro-acoustic transducer;

(d) a high-pass filter having an input and having an outout electrically coupled to an input of the high frequency electro-acoustic transducer; and (e) a variable resistor network including:

a first variable resistance and a second variable resistance coupled in series between a first resistor network terminal and a second resistor network terminal; and a wiper contact with the first variable resistance and the second variable resistance for adjusting the total resistance between the resistive network terminals;

(f) the variable resistor network terminals being coupled in parallel with the low-pass filter and in series with the band-pass filter; and (g) the wiper contact being electrically coupled to the high-pass filter input.

11. The frequency distribution and adjusting circuit of claim 10 wherein the variable resistor network comprises an L-pad.

12. The frequency distribution and adjusting circuit of claim 11 wherein the L-pad comprises a two-channel L-pad.

13. The frequency distribution and adjusting circuit of claim 12 wherein each channel of the two-channel L-pad has a separate channel wiper contact and the channel wiper contacts are electrically connected to each other.

14. The frequency distribution and adjusting circuit of claim 10 wherein each of the first variable resistance and the second variable resistance comprise a wire winding.

15. The frequency distribution and adjusting circuit of claim 10 wherein the low-pass filter comprises an inductor coupled in series with an input to the low frequency electro-acoustic transducer.

16. The frequency distribution and adjusting circuit of claim 15 wherein the, inductor has an inductance in the range from about 1 millihenry to about 12 millihenries, the first variable resistance has a value that can be adjusted between about zero and about 8 ohms and the second variable resistance has a value that can be adjusted between about zero and about 8 ohms.

17. The frequency distribution and adjusting circuit of claim 10 wherein the high-pass filter comprises a capacitor coupled in series with an input to the high frequency electro-acoustic transducer.

18. The frequency distribution and adjusting circuit of claim 17 wherein the capacitor has a capacitance in the range from about 1 microfarad to about 5 microfarads, the first variable resistance has a value that can be adjusted between about zero and about 8 ohms and the second variable resistance has a value that can be adjusted between about zero and about 8 ohms.

19. The frequency distribution and adjusting circuit of claim 10 wherein the band-pass filter comprises the inductor and a second capacitor coupled in series with an input to the midrange electro-acoustic transducer.

20. The frequency distribution and adjusting circuit of claim 19 wherein the second capacitor has a capacitance in the range from about 50 microfarads to about 200 microfarads, the first variable resistance has a value that can be adjusted between about zero and about 8 ohms and the second variable resistance has a value that can be adjusted between about zero and about 8 ohms.

21. In an audio system, a frequency distribution and adjusting circuit for partitioning by frequency an electrical audio signal, as provided by an amplifier, into a plurality of electrical audio frequency bands comprising a high frequency band, a midrange frequency band and a low frequency band for powering a corresponding plurality of electro-acoustic transducers comprising a high frequency electro-acoustic transducer, a midrange electro-acoustic transducer and a low frequency electro-acoustic transducer, the frequency distribution and adjusting circuit comprising:

(a) an input for receiving the electrical audio signal from the amplifier;

(b) a low-pass filter having an input electrically coupled to the electrical audio signal input and an output electrically coupled to an input of the low frequency electro-acoustic transducer;

(c) a band-pass filter having an input and having an output electrically coupled to an input of the midrange electro-acoustic transducer;

(d) a high-pass filter having an input and having an output electrically coupled to an input of the high frequency electro-acoustic transducer;

(e) resistive network means for providing a total variable resistance equal to the sum of a first variable resistance R1V and a second variable resistance R2V in parallel with the low-pass filter and in series with the band-pass filter and for providing the second variable resistance R2V in series with the high-pass filter, the resistive network means having an input electrically coupled to the electrical audio signal input, a first output coupled to the high pass filter input and a second output electrically coupled to the band-pass filter input; and (f) means for simultaneously varying the value of the variable resistances R1V and R2V.

22. The frequency distribution and adjusting circuit of claim 21 wherein the resistive network means comprises an L-pad.

23. The frequency distribution and adjusting circuit of claim 22 wherein the L-pad comprises a two-channel L-pad.

24. The frequency distribution and adjusting circuit of claim 23 wherein each channel of the two-channel L-pad has a separate channel wiper contact and the channel wiper contacts are electrically connected to each other.

25. The frequency distribution and adjusting circuit of claim 21 wherein each of the first variable resistance R1V and the second variable resistance R2V are approximately equal.

26. The frequency distribution and adjusting circuit of claim 21 wherein each of the first variable resistance R1V and the second variable resistance R2V comprise a wire winding.

27. In an audio system, a frequency distribution and adjusting circuit for partitioning by frequency an electrical audio signal, as provided by an amplifier, into a plurality of electrical audio frequency bands comprising a high frequency band and a low frequency band for powering a corresponding plurality of electro-acoustic transducers comprising a high frequency electro-acoustic transducer and a low frequency electro-acoustic transducer, the frequency distribution and adjusting circuit comprising:

(a) an input for receiving the electrical audio signal from the amplifier;

(b) a low-pass filter having an input electrically coupled to the electrical audio signal input and an output electrically coupled to an input of the low frequency electro-acoustic transducer;

(d) a high-pass filter having an input and having an output electrically coupled to an input of the high frequency electro-acoustic transducer;

(e) resistive network means for providing a total variable resistance value equal to the sum of a first variable resistance R1V and a second variable resistance R2V in parallel with the low-pass filter for providing a variable resistance R2V in series with the high-pass filter, the resistive network means having an input electrically coupled to the electrical audio signal input, a first output coupled to the high pass filter input and a second output electrically coupled to the low frequency electro-acoustic transducer input; and (f) means for simultaneously varying the value of the variable resistances R1V and R2V.

28. The frequency distribution and adjusting circuit of claim 27 wherein the resistive network means comprises an L-pad.

29. The frequency distribution and adjusting circuit of claim 28 wherein the L-pad comprises a two-channel L-pad.

30. The frequency distribution and adjusting circuit of claim 29 wherein each channel of the two-channel L-pad has a separate channel wiper contact and the channel wiper contacts are electrically connected to each other.

31. The frequency distribution and adjusting circuit of claim 27 wherein each of the first variable resistance R1V and the second variable resistance R2V are approximately equal.

32. The frequency distribution and adjusting circuit of claim 27 wherein each of the first variable resistance R1V and the second variable resistance R2V comprise a wire winding.

* * * * *